US012800387B2

(12) United States Patent
Zhang et al.

(10) Patent No.: US 12,800,387 B2
(45) Date of Patent: Nov. 17, 2026

(54) REDUCING DARK COUNT RATE OF SNSPD BASED ON TWO-WIRE STRUCTURE

(71) Applicant: NANJING UNIVERSITY, Nanjing (CN)

(72) Inventors: Labao Zhang, Nanjing (CN); Rui Yin, Nanjing (CN); Biao Zhang, Nanjing (CN); Qi Chen, Nanjing (CN); Jiayu Lv, Nanjing (CN); Rui Ge, Nanjing (CN); Lin Kang, Nanjing (CN); Peiheng Wu, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 1003 days.

(21) Appl. No.: 18/011,394

(22) PCT Filed: Apr. 7, 2021

(86) PCT No.: PCT/CN2021/085775
§ 371 (c)(1),
(2) Date: Dec. 19, 2022

(87) PCT Pub. No.: WO2021/253931
PCT Pub. Date: Dec. 23, 2021

(65) Prior Publication Data
US 2023/0304857 A1 Sep. 28, 2023

(30) Foreign Application Priority Data
Jun. 18, 2020 (CN) ........................ 202010557380.4

(51) Int. Cl.
*G01J 1/44* (2006.01)
*H10N 60/83* (2023.01)

(52) U.S. Cl.
CPC ................ *G01J 1/44* (2013.01); *H10N 60/83* (2023.02); *G01J 2001/442* (2013.01); *G01J 2001/444* (2013.01); *G01J 2001/4446* (2013.01)

(58) Field of Classification Search
CPC .................................. G01J 1/44; H10N 60/83
See application file for complete search history.

(56) References Cited

U.S. PATENT DOCUMENTS 10,636,918 B2 4/2020 Spector et al.
2017/0092834 A1* 3/2017 Fong ........................ G01J 5/20
(Continued)

FOREIGN PATENT DOCUMENTS

CN 107507884 A 12/2017
CN 111130652 A 5/2020
CN 111721429 A 9/2020

*Primary Examiner* — Paul A Wartalowicz
(74) *Attorney, Agent, or Firm* — MUNCY, GEISSLER, OLDS & LOWE, P.C.

(57) ABSTRACT

The present invention discloses a design for reducing a dark count rate of a superconducting nanowire single photon detector (SNSPD) based on a two-wire structure, which includes: intertwining two niobium nitride nanowires that are not crossed to form an SNSPD of a two-wire structure; regulating and controlling behaviors of one nanowire by adopting the other nanowire, and regulating bias current to be close to superconducting critical current; introducing an optical signal into a photosensitive area of the detector by adopting an optical fiber; outputting two channels of signals respectively through the two nanowires to make the dark count rates of the two nanowires mutually excited; and through a voltage comparator and an exclusive-OR gate, reducing a dark count rate signal, and retaining a photon response signal. The generation of the dark count rate of the detector can be inhibited effectively by the unique performance of the SNSPD of the two-wire structure; and by
(Continued)

improving the process latter, the coupling efficiency of the dark count rate of the SNSPD is further improved, which is expected to completely inhibit the dark count rate of the SNSPD system and greatly increase the signal-to-noise ratio of the detector.

8 Claims, 6 Drawing Sheets

(56) References Cited

U.S. PATENT DOCUMENTS

2018/0364097 A1 12/2018 Najafi
2021/0135084 A1* 5/2021 Onen ........................ G01J 1/44

* cited by examiner

REDUCING DARK COUNT RATE OF SNSPD BASED ON TWO-WIRE STRUCTURE

TECHNICAL FIELD

The present invention belongs to the technical field of superconducting single photon detection, and particularly relates to a reduction technology for a dark count rate.

BACKGROUND ART

A superconducting nanowire single photon detector (SNSPD) is a novel photodetector with high detection efficiency, high detection speed and low time jitter; and a photosensitive part is a winding structure of a nanowire made of a superconducting thin film material.

When in work, the detector is biased at a position slightly lower than superconducting critical current; after the nanowire absorbs photons, a superconducting state of an absorption area is destroyed, resulting in a hot spot; with the assistance of joule heat of the current, the hot spot grows to a certain range; and after the nanowire and a substrate are cooled, the hot spot disappears, and the nanowire is restored to an initial state.

A process in which the detector absorbs the photons is manifested as an electric pulse that rises rapidly and is then attenuated exponentially on circuit; and by amplifying a pulse signal, the detector can identify the arrival of a single photon.

A dark count rate (DCR) refers to a response pulse outputted by the SNSPD when no photon is incident, which represents background noise of SNSPD; the dark count rate of the SNSPD is generally classified into a background radiation dark count rate and an intrinsic dark count rate; the background radiation dark count rate is mainly caused by background heat radiation of an optical fiber and external interference; and the cause of the intrinsic dark count rate is not confirmed by definite experiments at present, and theoretical physicists give different explanations around the problem.

At present, there are two acceptable formations of the intrinsic dark count rate: one is based on vortex-antivortex pair breaking, and the other one is based on nanowire boundary vortex crossing; the background radiation dark count rate generally works at relatively low bias current, and a counting rate is relatively low and usually several to several tens of Hz; the intrinsic dark count rate works when the bias current is close to the superconducting critical current, and the counting rate is relatively high; and moreover, with the increase of the current, the intrinsic dark count rate increases dramatically.

The dark count rate may reduce a signal-to-noise ratio of a system and reduce the reliability of the signal outputted by the SNSPD; when the SNSPD is applied to a communication system, the DCR may greatly increase a bit error rate; and therefore, it is a research hotspot to reduce the dark count rate of the SNSPD.

For the background radiation dark count rate, a conventional method is mainly to eliminate the background radiation by adopting an optical-fiber filter at a low temperature at present; and there is no good general method for the intrinsic dark count rate.

SUMMARY OF THE INVENTION

In order to solve the problems in the prior art, the present invention provides an SNSPD device of a two-wire structure; two nanowires that are intertwined but not crossed are prepared; and in order to realize the above purpose, the influence of an intrinsic dark count rate of an SNSPD system can be inhibited effectively by unique performance of the device and processing of external circuits; and the present invention adopts the following technical solution.

Two niobium nitride nanowires that are not crossed are intertwined to form an SNSPD of a two-wire structure; one nanowire is used to regulate and control behaviors of the other nanowire, and bias current is adjusted to be close to superconducting critical current; an optical fiber is used to introduce an optical signal into a photosensitive area of the detector; two channels of signals are outputted respectively through the two nanowires, so that the dark count rates of the two nanowires are mutually excited; and through a voltage comparator and an exclusive-OR gate, the dark count rate signals are reduced, and a photoresponse signal is retained.

Further, the two niobium nitride nanowires that are not crossed are intertwined, which includes: the two nanowires are arranged side by side; from left to right, a length is 10-20 μm, a width is 50-80 nm, and a thickness is designed to be 5-8 nm; and a minimal distance between the two nanowires is 50-120 nm, a maximal distance is 300-400 nm, and an intertwining cycle is 9-20 times.

At a corner of the nanowires, an external nanowire surrounds an internal nanowire; an internal radius of the corner is 200-250 nm, and an external radius is 300-400 nm; a single wire has a width of 80 nm; the two nanowires are led out respectively by four electrodes; and the intertwining cycle is 9 times.

A nanowire chip has an edge length of 5 mm; a center area is a nanowire structure; 11 electrodes that changes gradually from wide to narrow are distributed around the nanowire structure; a widest point is 0.7 mm and is connected with the external circuit; and a narrowest point is 0.01 mm and is connected with the nanowire.

Further, an NbN thin film is deposited by magnetron sputtering; a nanometer line is prepared by electron beam lithography; the nanometer line is transferred by reactive ion etching; a gold electrode is prepared by ultra-violet lithography; an upper reflection cavity is prepared by plasma enhanced chemical meteorological deposition; an upper gold reflection layer grows by magnetron sputtering, thereby preparing the nanowire; a surface appearance of the nanowire is observed by a scanning electron microscope; and if the nanowire has clear edges and small line roughness, the nanowire meets the design requirement.

Further, one nanowire is disconnected and does not work, and volt-ampere characteristics of the other nanowire are measured; and at a temperature of 200 mK, the superconducting critical current of the two nanowires is 11.7 μA, and the hysteresis current is 2.0 μA.

The photoresponse between the two nanowires are kept uncoupled, so that one nanowire couples the intrinsic dark count rate to the other nanowire, and outputs the dark count rate at the same time in time sequence.

Two channels of pulse signals containing a photon response signal and a dark count rate signal are inputted into the voltage comparator and shaped into a TTL signal that is inputted into the exclusive-OR gate; two channels of high-level signals caused by the dark count rate are outputted as low level; the two channels of low-level signals caused by no photon response are outputted as low level; and one channel of high-level signal and one channel of low-level signal caused by the photon response are outputted as high level.

According to the present invention, the generation of the dark count rate of the detector can be inhibited effectively by the unique performance of the SNSPD of the two-wire structure; and by improving the process latter, the coupling efficiency of the dark count rate of the SNSPD is further improved, which is expected to completely inhibit the dark count rate of the SNSPD system, and greatly increase the signal-to-noise ratio of the detector.

DETAILED DESCRIPTION OF THE INVENTION

The present invention is described in detail below in combination with the drawings.

An SNSPD of a two-wire structure is a device formed by two niobium nitride (NbN) nanowires that are intertwined but not crossed; and the SNSPD of the two-wire structure differs from the structure of the traditional nanowire in that the traditional nanowire is formed by intertwining a single nanowire.

Figure 10:
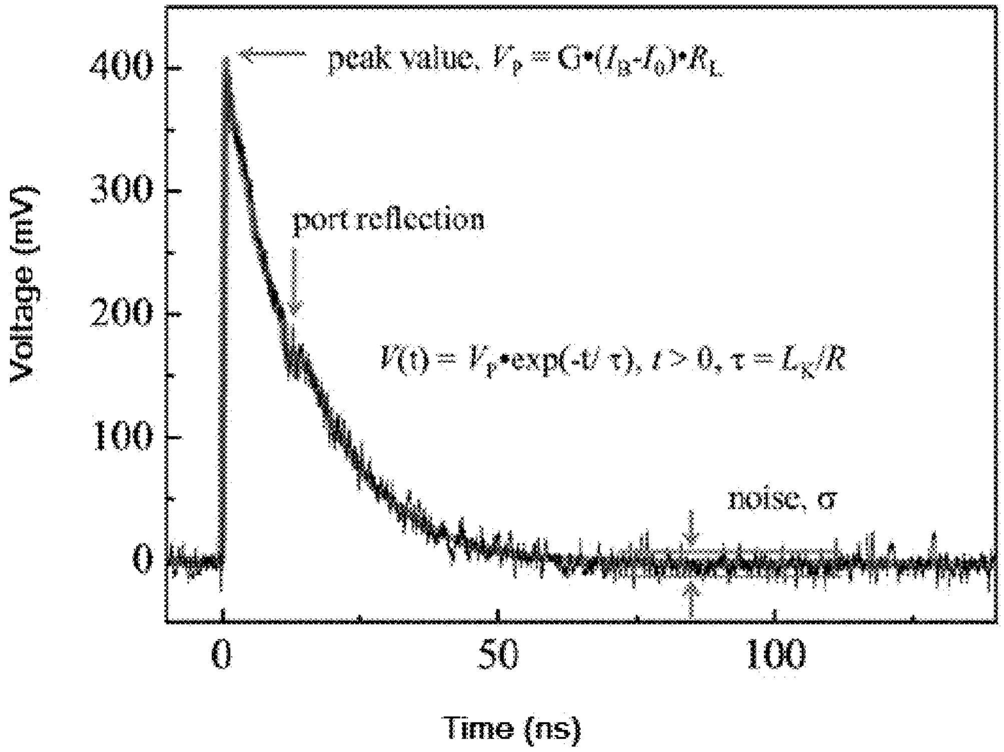
FIG. 10 shows an output pulse of a detector.

When in work, the detector is biased at a position slightly lower than superconducting critical current; after the nanowire absorbs photons, a superconducting state of an absorption area is destroyed, resulting in a hot spot; with the assistance of joule heat of the current, the hot spot grows to a certain range; after the nanowire and a substrate are cooled, the hot spot disappears, and the nanowire is restored to an initial state; a process in which the detector absorbs photons is manifested as an electric pulse that rise rapidly and is then attenuated exponentially on circuit; and by amplifying a pulse signal, the detector can identify the arrival of a single photon, and the pulse outputted by the detector is shown in FIG. 10.

Figure 11:
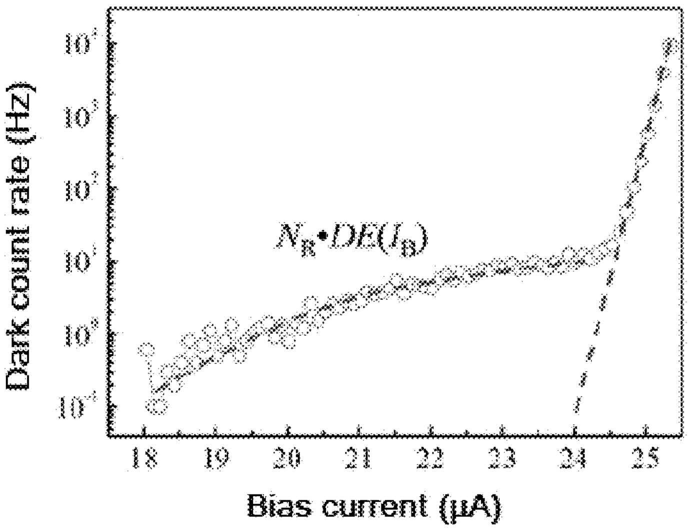
FIG. 11 shows reflection of the two dark count rates on a device.

A background radiation dark count rate generally works at relatively low bias current, and a counting rate is relatively low and usually several to several tens of Hz; an intrinsic dark count rate works when the bias current is close to the superconducting critical current, and the counting rate is relatively high; moreover, with the increase of the current, the intrinsic dark count rate increases dramatically; and the specific reflection of the two dark count rates on the device is shown in FIG. 11.

Figure 1:
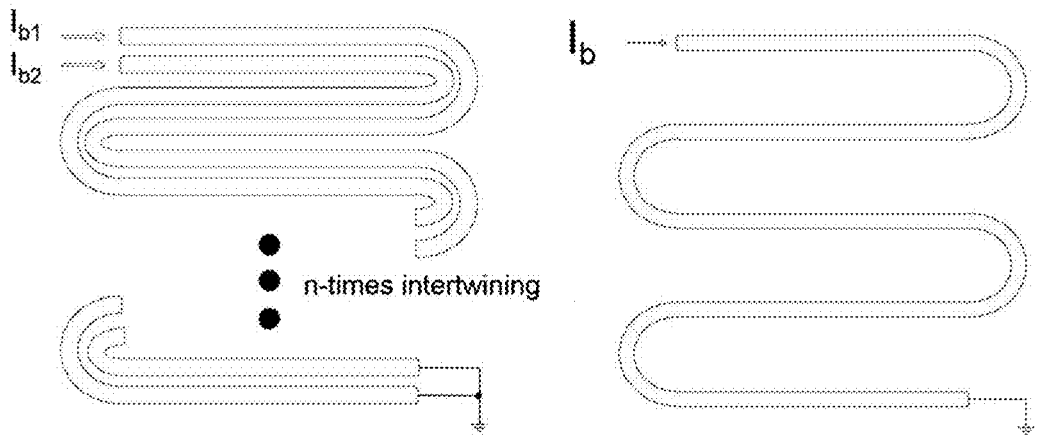
FIG. 1 shows structural difference between an SNSPD of a two-wire structure and a traditional SNSPD.

The difference between the SNSPD of the two-wire structure and the traditional SNSPD is shown in FIG. 1; and for convenience of description, numbers of the two nanowires are defined as No. 1 and No. 2 respectively.

The two nanowires are arranged side by side; from left to right, a length is designed to be 10-20 μm, and a line width of the nanowire is designed to be 50-80 nm; a minimal distance between the two nanowires is designed to be 50-120 nm, and a maximal distance is designed to be 300-400 nm; a thickness is designed to be 5-8 nm; and a intertwining cycle is 9-20 times.

Figure 2:
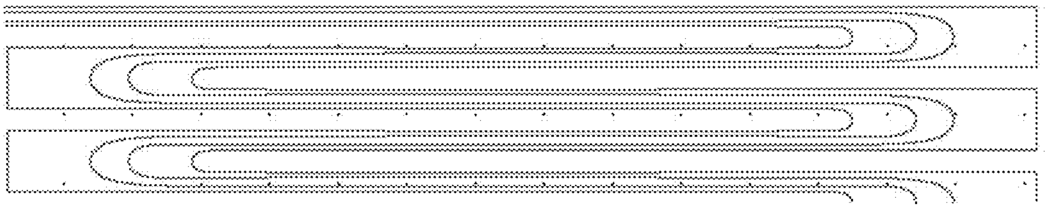
FIG. 2 shows a corner design of a nanowire.

A corner design of the nanowire is shown in FIG. 2; an external nanowire surrounds an internal nanowire; an internal radius of the corner is designed to be 200-250 nm, and an external radius is designed to be 300-400 nm; a single wire has a width of 80 nm; the two nanowires are led out respectively by four electrodes; and the intertwining cycle is designed to be 9 times, so that a crowding effect of the superconducting current is avoided.

Figure 3:
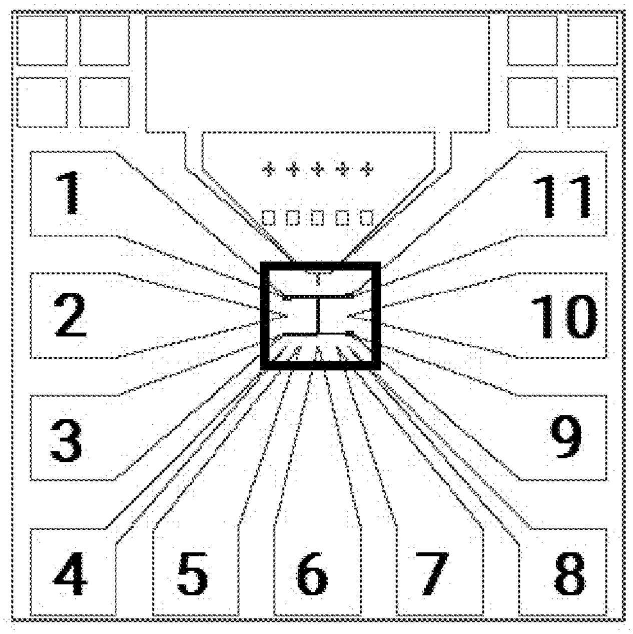
FIG. 3 shows a chip structure of the nanowire of two-wire structure.

A chip structure of the nanowire of the two-wire structure is shown in FIG. 3; the chip has an edge length of 5 nm; a center area is a nanowire structure and surrounded by 11 gold electrodes, but only No. 1, No. 3, No. 9 and No. 11 electrodes are used in practice, and the other electrodes are reserved; the electrodes are designed as a gradual change structure from wide to narrow; a widest point is 0.7 mm and is connected with an external circuit; and a narrowest point is 0.01 mm and is connected with the nanowire.

Figure 9:
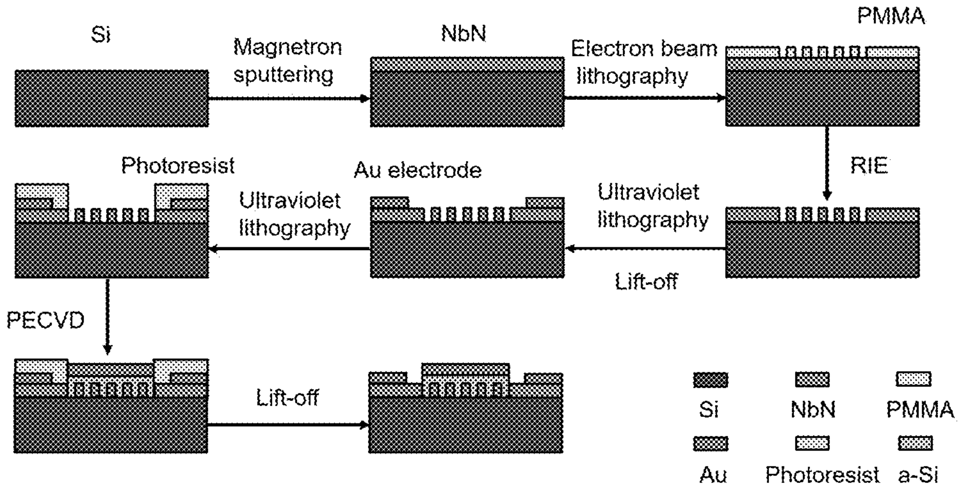
FIG. 9 is a flow chart of preparation of the nanowire.
Figure 12:
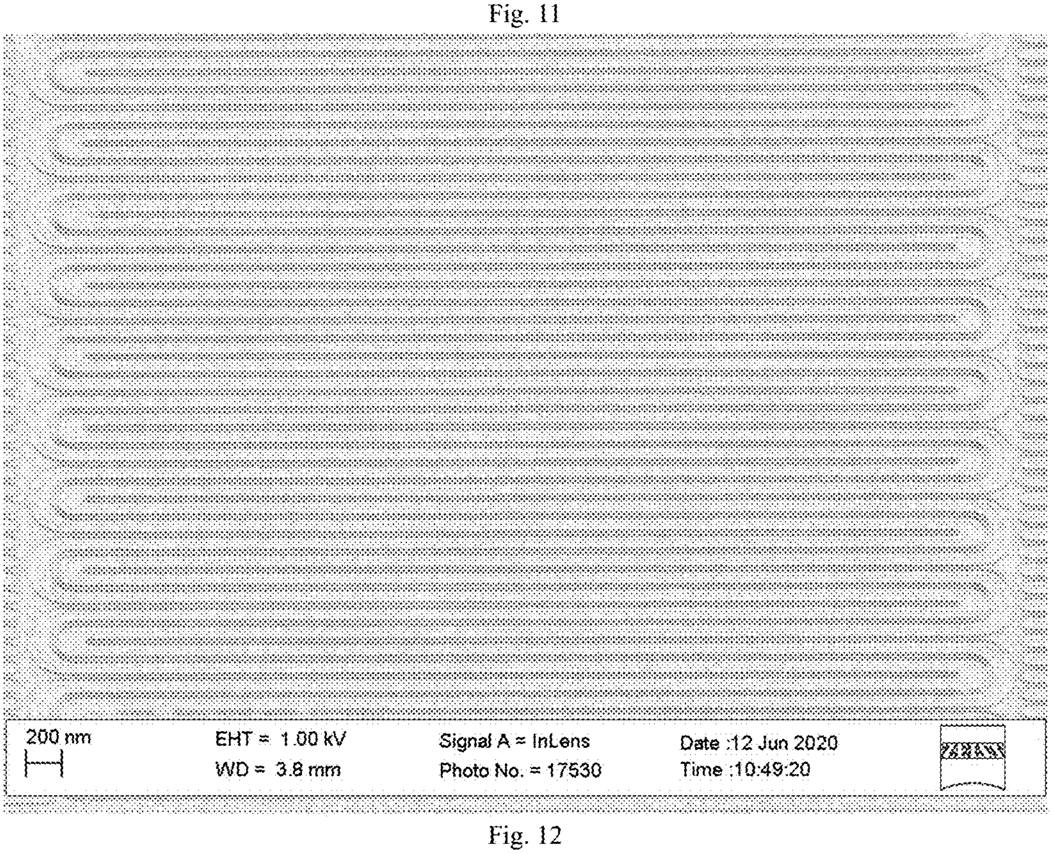
FIG. 12 shows a surface appearance of the nanowire.

A preparation process of the nanowire is shown in FIG. 9; an NbN thin film is deposited by magnetron sputtering; a nanometer line is prepared by electron beam lithography; the nanometer line is transferred by reactive ion etching; a gold electrode is prepared by ultra-violet lithography; an upper reflection cavity is prepared by plasma enhanced chemical meteorological deposition (PECVD); an upper gold reflection layer grows by magnetron sputtering; after the nanowire is prepared, a surface appearance of the nanowire is observed by a scanning electron microscope; and as shown in FIG. 12, if the nanowire has clear edges and small line roughness, the nanowire meets the design requirement.

Figure 4:
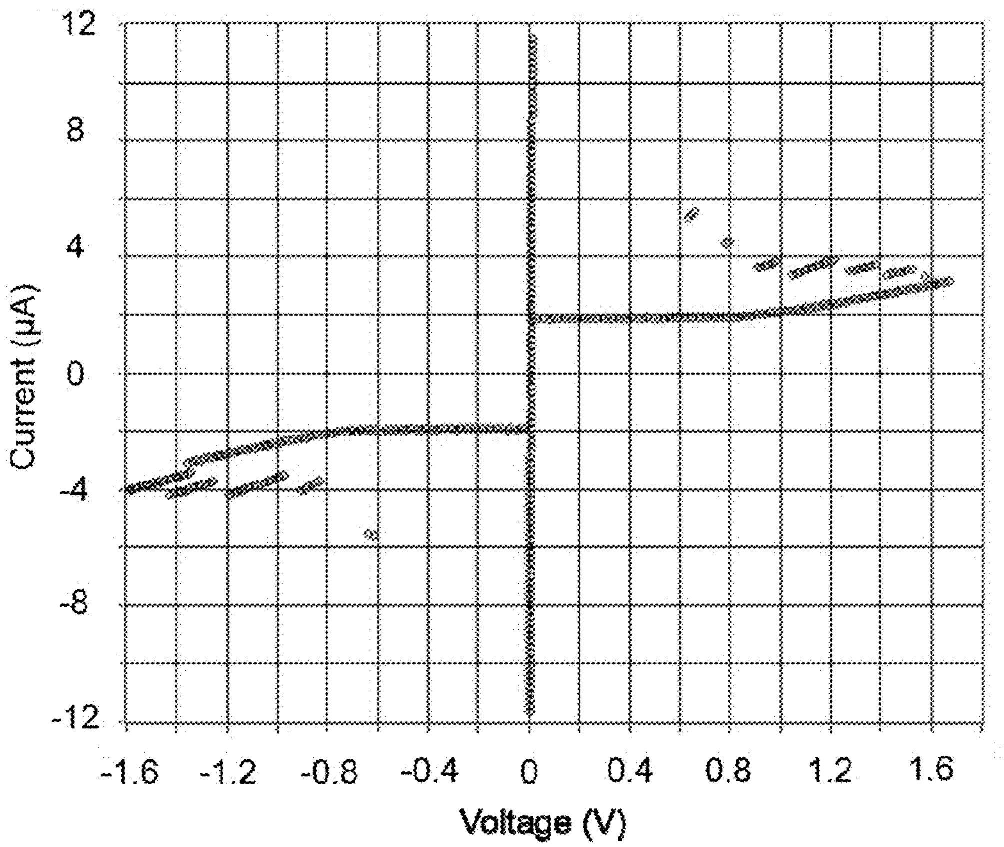
FIG. 4 is a bias I-V characteristic curve of the nanowire.
Figure 4:
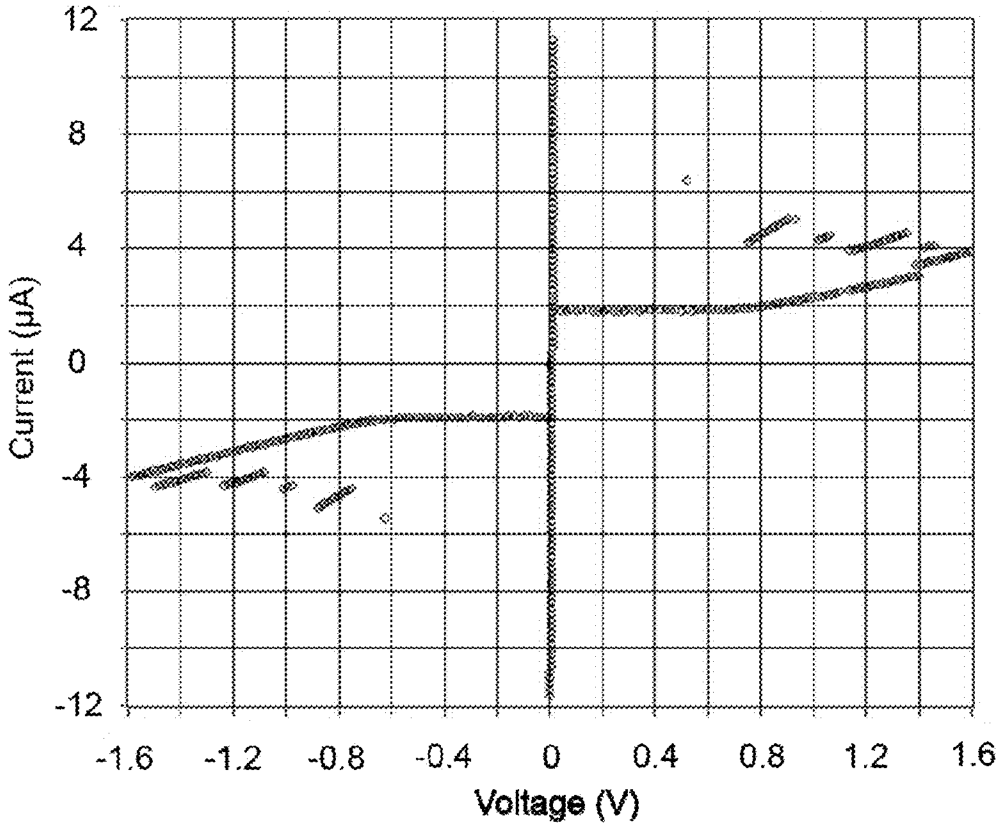

After the device is prepared, a curve representing I-V characteristics of the nanowire is shown in FIG. 4; one nanowire does not work, and volt-ampere characteristics of the other nanowire are measured; and at a temperature of 200 mK, the superconducting critical current of the two nanowires is 11.7 μA, and the hysteresis current is 2.0 μA.

One nanowire in the SNSPD of the two-wire structure is used to regulate and control behaviors of the other nanowire, such as the dark count rate, I-V characteristics, photoresponse and other characteristics; the bias current is regulated to be close to the superconducting critical current; the photoresponse is kept uncoupled, so that the No. 1 nanowire couples the intrinsic dark count rate to the No. 2 nanowire.

Figure 6:
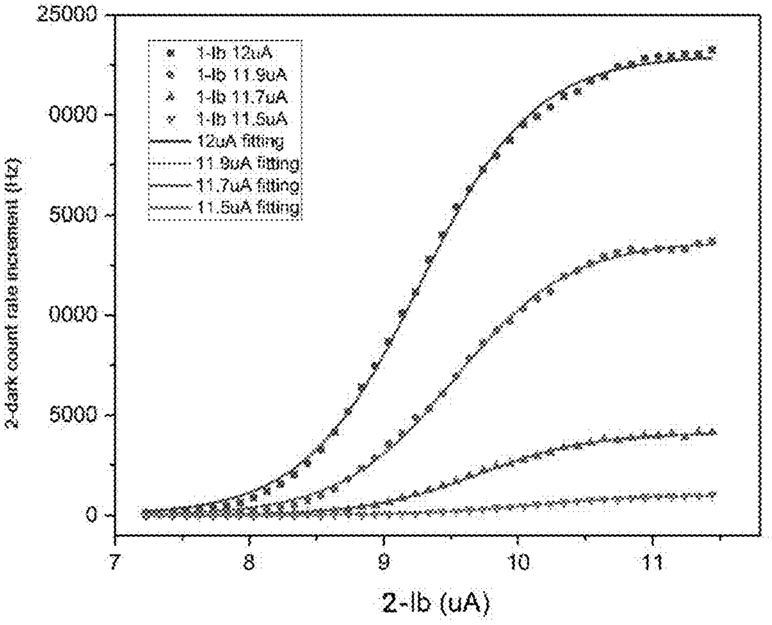
FIG. 6 is a growth curve of the dark count rate.

As shown in FIG. 6, at the temperature of 50 mK, when the bias current of the No. 1 nanowire is changed from 11.5 μA to 12 μA, all generated are basically the intrinsic dark count rate; and increments of the dark count rate of the nanowire 2 grow in an S-shaped curve at different growth rates.

When the bias current of the nanowire 2 is close to the critical current, the increment of the DCR is nearly saturated; when the dark count rate of the No. 1 nanowire is fixed, a ratio of the increment of the dark count rate of the No. 2 nanowire to the dark count rate of the No. 1 nanowire defines a dark count rate coupling efficiency $\eta_{12}$.

The dark count rate coupling efficiency is about 0.5, that is to say, about half of the intrinsic dark count rate of the No. 1 nanowire can excite the No. 2 nanowire to generate corresponding DCR.

Figure 7:
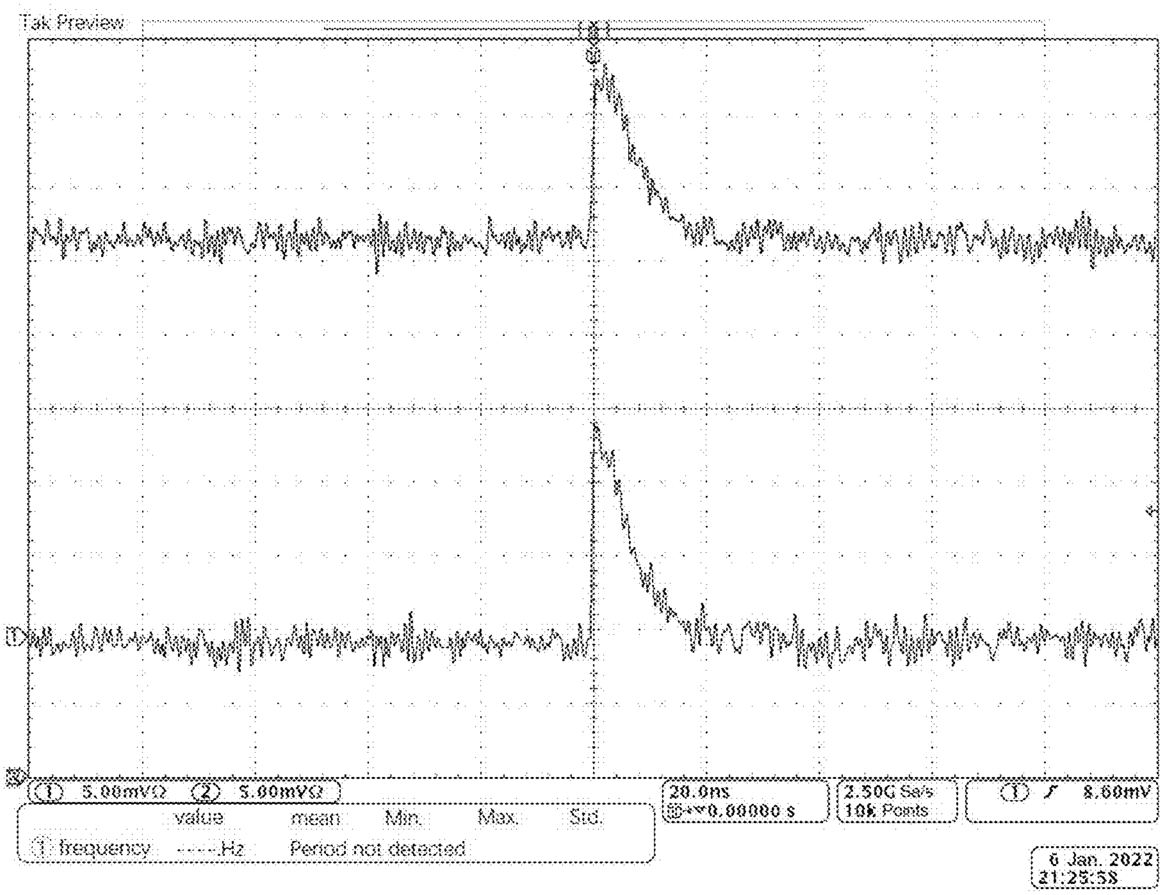
FIG. 7 shows a coupling waveform of the dark count rate.

As shown in FIG. 7, an oscilloscope captures a coupling waveform of the dark count rates; the dark count rates of the two nanowires appear in the oscilloscope at the same time;

and in the time domain, the dark count rates of the two nanowires appear almost at the same time, and a time difference is less than 1 ns.

Figure 8:
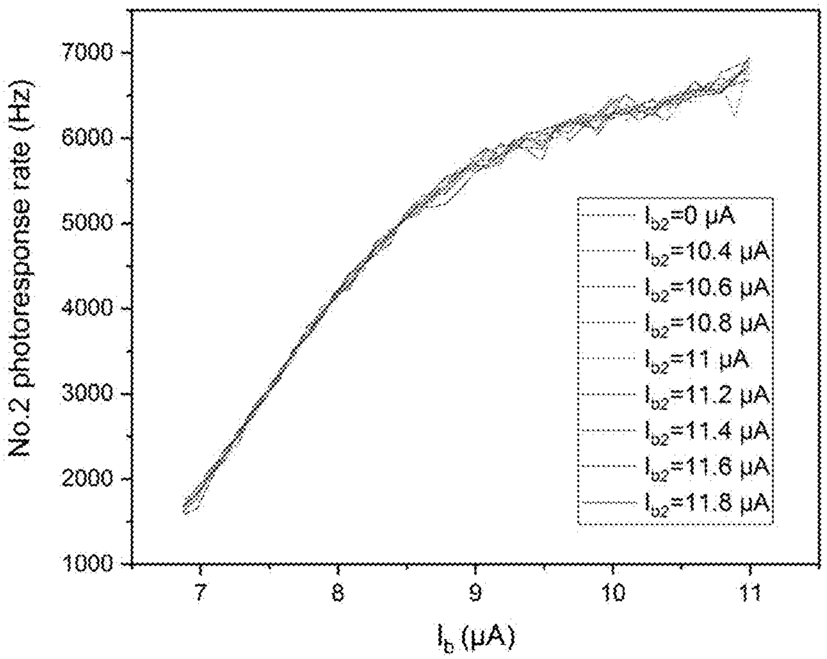
FIG. 8 is a growth curve of photoresponse.

Different from the case where the dark count rates can be mutually coupled, the photoresponse of the No. 1 nanowire can hardly increase the photoresponse counting rate of the No. 2 nanowire; as shown in FIG. 8, the photoresponse of the No. 2 nanowire changes with the change of the bias current of the No. 1 nanowire; the used light intensity is 13 pW, and a light wavelength is 1064 nm; a temperature of the device is 2.5 K; and the photoresponse of the No. 2 nanowire has no obvious growth trend with the increase of the photoresponse of the No. 1 nanowire; and the photoresponse of the two nanowires basically has no coupling phenomenon.

Figure 5:
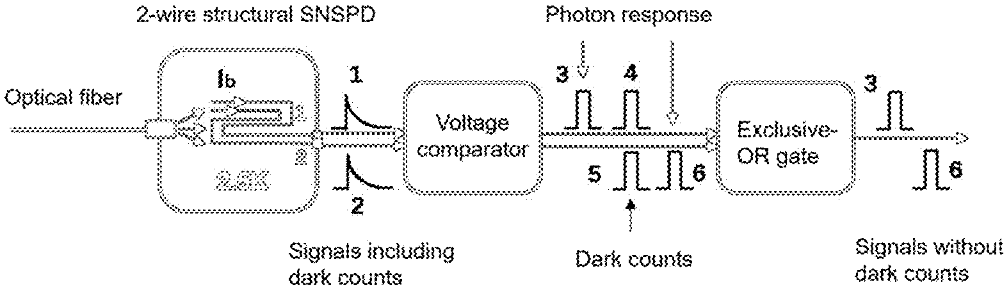
FIG. 5 is a circuit design of a two-wire structure for reducing a dark count rate.

In the SNSPD of the two-wire structure, the dark count rates of the nanowires are coupled in the coupling efficiency of 50%, the photoresponse has no coupling, and a design circuit is as shown in FIG. 5; an optical fiber is used to introduce an optical signal into a photosensitive area of the detector, so that the detector works in a temperature environment of 2.5 K.

Two channels of signals are respectively outputted through two nanowires, which are respectively represented by No. 1 and No. 2 pulses; the signals include a photon response signal and a dark count rate signal; the two channels of signals are inputted into a voltage comparator and shaped into a TTL signal; No. 4 and No. 5 pulses are used to indicate the dark count rate signals outputted by the SNSPD; No. 3 and No. 6 pulses are used to indicate the photon response signals; and the two channels of signals are inputted into an exclusive-OR gate.

Since the dark count rates of the two nanowires are mutually excited, the dark count rates of the two nanowires are outputted at the same time in time sequence, but the photon responses cannot be influenced by each other and are outputted randomly in the time sequence; by using a logic operation of the exclusive-OR gate, when the two channels of signals are both at high level, the output of the exclusive-OR gate is at low level, corresponding to the case of dark count rate; when only one of the two channels of signals is at high level, the output of the exclusive-OR gate is at high level, corresponding to a case of photon response; and when both channels of signals are at low level, the output of the exclusive-OR gate is at low level, corresponding to the case of no photon response and no dark count rate.

| Input end 1 | Input end 2 | Output end | Output state of a detector |
|---|---|---|---|
| 0 | 0 | 0 | No response |
| 0 | 1 | 1 | Photon response |
| 1 | 0 | 1 | Photon response |
| 1 | 1 | 0 | Dark count rate |

In this way, the output of the dark count rate of the SNSPD is inhibited effectively at an output end of the exclusive-OR gate; and the final outputs are only No. 3 and No. 6 pulses, i.e. photon response signals.

The above description is only preferred embodiments of the present invention and is not intended to limit the present invention. Any modifications, equivalent substitution and improvements made within the spirit and principles of the present invention shall be contained within the protection scope of the present invention.

The invention claimed is:

1. A method for reducing a dark count rate of a superconducting nanowire single photon detector (SNSPD) based on a two-wire structure, comprising: intertwining two niobium nitride (NbN) nanowires that are not crossed to form a superconducting nanowire single photon detector (SNSPD) of a two-wire structure; using a first nanowire to regulate and suppress dark count excitation behaviors of the second nanowire, wherein a bias current of the first nanowire is adjusted to be proximate to its superconducting critical current; introducing an optical signal into a photosensitive area of the detector by using an optical fiber; outputting two channels of signals respectively through the two nanowires to make the dark count rates of the two nanowires mutually excited; and through a voltage comparator and an exclusive-OR gate, reducing the dark count rate signals, and retaining a photo response signal.

2. The method for reducing the dark count rate of SNSPD based on the two-wire structure according to claim 1, wherein the intertwining the two niobium nitride nanowires that are not crossed comprises: the two nanowires are arranged side by side; from left to right, each of the two nanowires has a length and a width, the length is 10-20 μm, the width is 50-80 nm, and a thickness is designed to be 5-8 nm; and a minimal distance between the two nanowires is 50-120 nm, a maximal distance is 300-400 nm, and an intertwining cycle is 9-20 times.

3. The method for reducing the dark count rate of SNSPD based on the two-wire structure according to claim 1, wherein the two-wire structure comprises: at a corner of the nanowires, an external nanowire surrounds an internal nanowire; an internal radius of the corner is 200-250 nm, and an external radius is 300-400 nm; each of the two nanowires has a width of 80 nm; the two nanowires are led out respectively by four electrodes; and the intertwining cycle is 9 times.

4. The method for reducing the dark count rate of SNSPD based on the two-wire structure according to claim 1, wherein the SNSPD comprises: a nanowire chip has an edge length of 5 mm; a center area is a nanowire structure; 11 electrodes that changes gradually from wide to narrow are distributed around the nanowire structure; a widest point is 0.7 mm and is connected with the external circuit; and a narrowest point is 0.01 mm and is connected with the nanowire.

5. The method for reducing the dark count rate of SNSPD based on the two-wire structure according to claim 1, wherein the SNSPD comprises: an NbN thin film is deposited by magnetron sputtering; a nanometer line is prepared by electron beam lithography; the nanometer line is transferred by reactive ion etching; a gold electrode is prepared by ultra-violet lithography; an upper reflection cavity is prepared by plasma enhanced chemical meteorological deposition; an upper gold reflection layer grows by magnetron sputtering, thereby preparing the nanowire; a surface appearance of the nanowire is observed by a scanning electron microscope; and if the nanowire has clear edges and small line roughness, the nanowire meets the design requirement.

6. The method for reducing the dark count rate of SNSPD based on the two-wire structure according to claim 1, wherein the adjusting bias current to be close to superconducting critical current comprises: one nanowire is disconnected and does not work, and volt-ampere characteristics of the other nanowire are measured; and at a temperature of 200 mK, the superconducting critical current of the two nanowires is 11.7 μA, and the hysteresis current is 2.0 μA.

7. The method for reducing the dark count rate of SNSPD based on the two-wire structure according to claim 1, wherein the dark count rates of the two nanowires are mutually excited, which comprises: the photoresponse between the two nanowires are kept uncoupled, so that one nanowire couples the intrinsic dark count rate to the other nanowire, and outputs the dark count rate at the same time in time sequence.

8. The method for reducing the dark count rate of SNSPD based on the two-wire structure according to claim 7, wherein through a voltage comparator and an exclusive-OR gate comprises: two channels of pulse signals containing a photon response signal and a dark count rate signal are inputted into the voltage comparator and shaped into a TTL signal that is inputted into the exclusive-OR gate; two channels of high-level signals caused by the dark count rate are outputted as low level; the two channels of low-level signals caused by no photon response are outputted as low level; and one channel of high-level signal and one channel of low-level signal caused by the photon response are outputted as high level.

* * * * *